(12) United States Patent
Ukai et al.

(10) Patent No.: US 9,089,084 B2
(45) Date of Patent: Jul. 21, 2015

(54) METHOD TO PRODUCE OPTICAL TRANSCEIVER

(71) Applicant: Sumitomo Electric Device Innovations, Inc., Yokohama-shi (JP)

(72) Inventors: Toru Ukai, Yokohama (JP); Moriyasu Ichino, Yokohama (JP); Tadashi Sakai, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 227 days.

(21) Appl. No.: 13/773,132

(22) Filed: Feb. 21, 2013

(65) Prior Publication Data
US 2013/0219697 A1 Aug. 29, 2013

(30) Foreign Application Priority Data

Feb. 23, 2012 (JP) ................... 2012-037854

(51) Int. Cl.
*H05K 13/00* (2006.01)
*H04B 10/40* (2013.01)

(52) U.S. Cl.
CPC ............... *H05K 13/00* (2013.01); *H04B 10/40* (2013.01); *Y10T 29/49004* (2015.01)

(58) Field of Classification Search
CPC ... H05K 13/00; H04B 10/40; Y10T 29/49004
USPC ................................. 29/592.1, 832
See application file for complete search history.

(56) References Cited

U.S. PATENT DOCUMENTS

| 7,639,954 | B2 * | 12/2009 | Lam et al. | 398/198 |
| 7,715,728 | B2 * | 5/2010 | Kijima et al. | 398/182 |
| 7,949,025 | B2 * | 5/2011 | Olea | 372/38.02 |
| 2007/0081567 | A1 * | 4/2007 | Lam et al. | 372/38.07 |

FOREIGN PATENT DOCUMENTS

WO 2007/069045 A1 * 6/2007

* cited by examiner

*Primary Examiner* — Carl Arbes
(74) *Attorney, Agent, or Firm* — Venable LLP; Michael A. Sartori; Tamatane J. Aga

(57) ABSTRACT

A method to control an optical transceiver, in particular, to drive an LD installed within the optical transceiver is described. The LD in the bias current thereof is determined by the automatic power control (APC) loop to keep an average of the optical output power. The modulation current is determined by a feedback loop to keep the extinction ratio (ER) in a preset range. The initial condition of the modulation current for the feedback loop is set by T-Im characteristic. The T-Im characteristic is first derived based on data measured in a status of the LD not installed in the transceiver. The T-Im characteristic is revised timely by the modulation current practically obtained for the optical transceiver.

6 Claims, 3 Drawing Sheets

METHOD TO PRODUCE OPTICAL TRANSCEIVER

BACKGROUND OF THE INVENTION

1. Field of the Invention

The present invention relates to a method to produce an optical transceiver that implements with a semiconductor laser diode (hereafter denoted as LD).

2. Related Background Arts

An optical transceiver generally installs a semiconductor laser diode (hereafter denoted as LD) as an optical source. Various prior arts have been disclosed methods to control the LD, where the methods keep the average optical power of the light output from the LD substantially in constant and the extinction ratio of the light also substantially in a preset range. Specifically, the optical transceiver prepares a temperature sensor, a look-up-table (hereafter denoted as LUT) which relates parameters for the LD with temperatures, and a controller. The controller, as referring to the LUT, adjusts the bias current and the modulation current each supplied to the LD.

In order to create such a LUT, various characteristics of the LD against the temperature are necessary. Generally, the average output power of the LD is kept substantially in constant by adjusting the bias current by an automatic power control (hereafter denoted as APC) circuit. However, the extinction ratio (ER), which is given by a ratio of the high level to the low level of the light output from the LD, namely, $ER = 10 \times \log\{P(1)/P(0)\}$, is conventionally adjusted only by setting the modulation current stored in the LUT. Because the extinction ratio depends on the temperature, the LUT is necessary to store many data for respective temperatures.

On the other hand, the measurement of the temperature dependence of the modulation current needs complex procedures. That is, the temperature of the optical transceiver is necessary to vary the ambient temperature. However, it takes longer time until the temperature of the LD in the optical transceiver becomes substantially equal to the ambient temperature of the optical transceiver. The characteristics of the LD measured in advance to the installation thereof within the optical transceiver, and it is very hard to regards the characteristics of the LD as performances of the optical transceiver. Accordingly, it is preferable to measure the performances of the LD at several temperatures and create a table, which is often called as a look-up-table (LUT), to convert the performances to those under general temperatures. Because of the discrepancy of the ambient temperature and that of the LD when the LD is enclosed within the optical transceiver, the LUT often lacks the accuracy. A technique to enhance the accuracy of the LUT has been desired.

SUMMARY OF THE INVENTION

An aspect of the present invention, in an exemplary embodiment thereof, relates to a method to form an optical transceiver that encloses an LD therein. The method includes steps of: (1) before the LD is installed in the optical transceiver, measuring an I-L characteristic of the LD, where the I-L characteristic relates a current supplied to the LD with optical power output from the LD, (2) installing the LD in the optical transceiver, and (3) determining a modulation current as varying a temperature optical optical transceiver by a feedback loop accompanying with an initial condition by referring to a look-up-table (LUT) relating the modulation current with temperatures. In the method of the embodiment, the modulation current is supplied to the LD to keep an extinction ratio of the light output from the optical transceiver in a preset range as a bias current also supplied to the LD is automatically determined by an automatic power control (APC) circuit to keep an average optical power output from the LD in a preset level. A feature according to the embodiment is that the LUT is revised by replacing data based on the I-L characteristic of the LD with the modulation current practically determined for the light output from the optical transceiver.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF PREFERRED EMBODIMENTS

Next, some preferred embodiments according to the present invention will be described as referring to drawings. In the description of the drawings, numerals or symbols same or similar to each other will refer to elements same or similar to each other without overlapping explanations.

Figure 1:
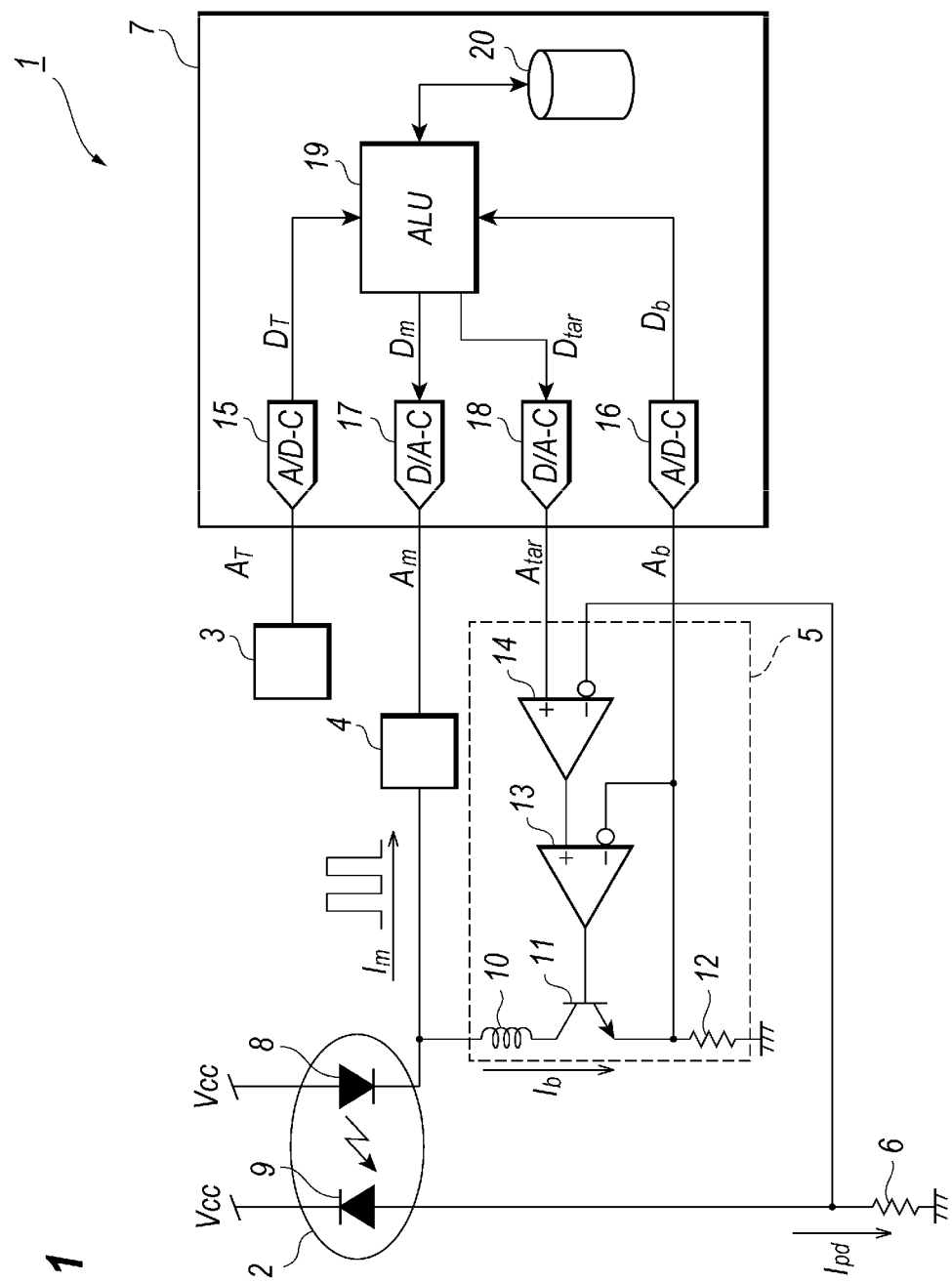
FIG. 1 schematically illustrates a functional block diagram of an optical transceiver subject of a method according to an embodiment of the present invention.

FIG. 1 schematically illustrates a functional block diagram of an optical transceiver 1, where embodiments according to the present invention relate to a method to form and control the optical transceiver 1. The optical transceiver 1 includes an optical subassembly (hereafter denoted as OSA) 2 enclosing an LD, a temperature sensor 3, a driver 4 for driving the LD, an automatic power control (hereafter denoted as APC) circuit, a reference resistor 6, and a controller 7.

The OSA 2 includes the LD 8 to emit light and a photodiode (hereafter denoted as PD) 9 to receive a portion of the light. Specifically, the LD 8 emits light from one facet, the front facet to be extracted from the optical transceiver 1 as signal light, while, the LD also emits light from another facet, the back facet, to the PD 9 as monitoring light. The monitoring light or an output of the PD 9 is used for controlling the magnitude of the light emitted from the front facet. The anode of the LD 8 and the cathode of the PD 9 are supplied with a bias Vcc from an outside of the optical transceiver 1. The anode of the PD 9 couples with the reference resistor 6 to cause a voltage drop thereat by providing a photocurrent $I_{pd}$ generated by the PD 9. The LD 8 in the cathode thereof couples with the driver 4 and the APC circuit 5. The embodiment shown in FIG. 1 installs the OSA 2 with functions of an optical transmitter and an optical receiver. However, the optical transceiver 1 may include a transmitter optical subassembly (TOSA) and a receiver optical subassembly (ROSA) individually.

The driver 4, by externally receiving a data signal switching between statuses of "1" and "0", generates a modulation current Im varying between two levels corresponding to the statuses "1" and "0", and provides this modulation current Im to the LD 8. The controller 7 adjusts a magnitude of the modulation current Im.

The APC circuit 5, which includes an inductor 10, a transistor 11, a resistor 12, and two differential amplifiers, 13 and 14, constitutes a feedback loop to control the bias current Ib supplied to the LD 8. The transistor 11 in the collector thereof couples with the cathode of the LD 8 via the inductor 10, the base couples with the differential amplifier 13, and the emitter, which is grounded via the resistor 12, couples with the inverting input of the differential amplifier 13 and the controller 7. The non-inverting input of the differential amplifier 14 couples with the controller 7, while, the inverting input of the differential amplifier 14 is connected to the anode of the PD 9. The differential amplifier 14 in the output thereof couples with the non-inverting input of the other differential amplifier 13. The APC circuit 5 thus configured detects a difference between an output $A_{tar}$ of the controller 7, which corresponds to a target optical power, and a voltage drop caused in the reference resistor 6 by the photocurrent $I_{pd}$ by the differential circuit 14. The other differential amplifier 13 and the transistor 11 adjusts the bias current Ib so as to cancel the difference detected by the differential amplifier 14

The controller 7 provides two analog-to-digital converter (hereafter denoted as A/D-C), 15 and 16; two digital-to-analog converter (hereafter denoted as D/A-C), 17 and 18; an arithmetic logic unit (hereafter denoted as ALU) 19; and a memory 20. The A/D-C 15 converts an analog signal $A_T$, which corresponds to an ambient temperature sensed by the temperature sensor 3, into a digital signal $D_T$. This digital signal $D_T$ is output to the ALU 19. The other A/D-C 16 converts an analog signal $A_b$, which corresponds to a voltage drop caused in the resistor 12 by flowing the bias current Ib therein, into a digital signal DB to output to the ALU 19.

The ALU 19 in the controller 7 determines a parameter $D_m$ corresponding to the modulation current for the current temperature, by accessing the look-up-table (hereafter denoted as LUT) in the memory 20 based on two parameters, $D_T$ and $D_b$, the former of which is provided from the temperature sensor 3. Thus determined parameter $D_m$ is provided to the driver 4 via the D/A-C 17. The driver 4 adjusts the modulation current Im provided to the LD 8 depending on this parameter $D_m$. The memory 20 stores, in a form of the LUT, a plurality of parameters each corresponding to the modulation current Im at various temperatures, which will be referred as T-Im characteristic.

Figure 2:
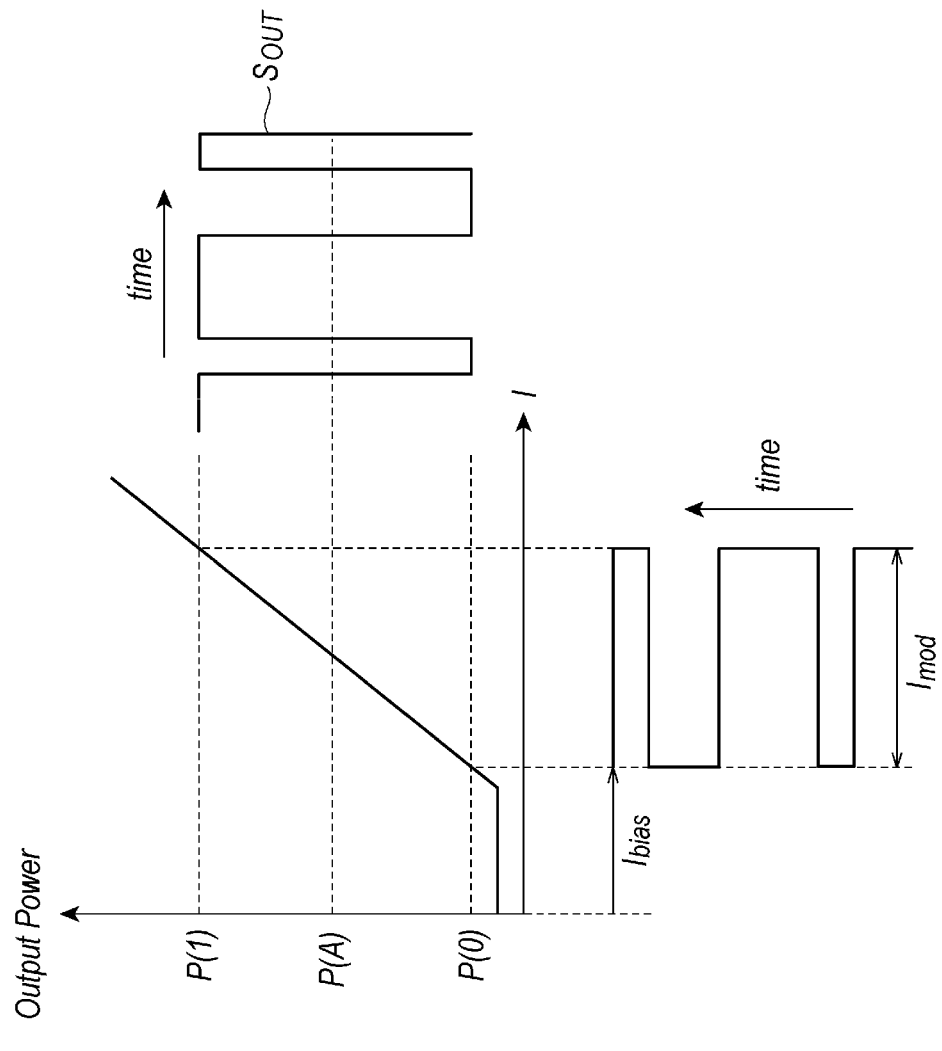
FIG. 2 explains a relation of the output power against the bias current and the modulation current.

FIG. 2 schematically illustrates a relation of optical power output from an LD against a current, which includes the modulation current Im and the bias current Ib, supplied to the LD, and this behavior is often called as the I-L characteristic. Supplying the modulation current Im, which switches between two levels of "1" and "0", adding to the bias current Ib, the LD emits light $S_{OUT}$ varying alternately between two levels of P(1) and P(0). The optical transceiver 1 operates so as to keep the average power P(A) in constant at the target power by the APC circuit and the extinction ratio ER determined by an equation of ER=10×log {P(1)/P(0)} in a preset range.

Figure 3:
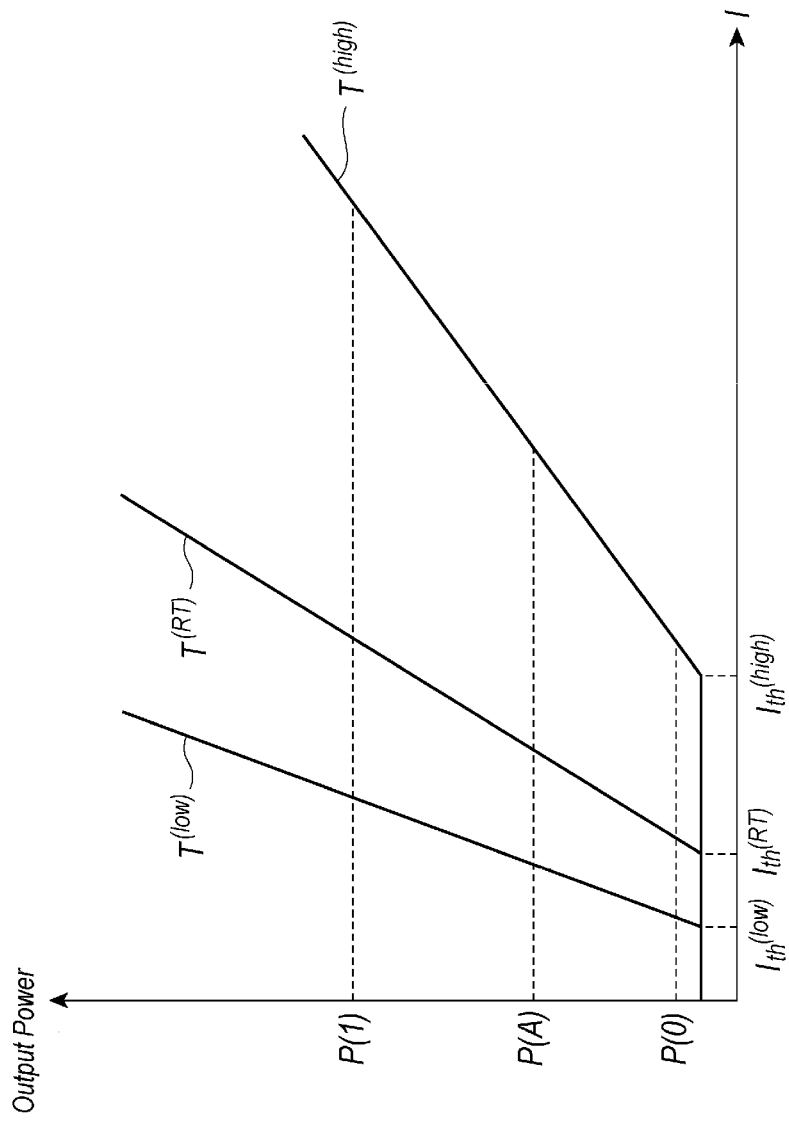
FIG. 3 exemplarily shows I-L characteristics at various temperatures.

FIG. 3 schematically illustrates the I-L characteristics at various temperatures. The threshold current $I_{th}^{(T)}$ monotonically increases from a low temperature $T^{(low)}$ to a high temperature $T^{(high)}$, and generally denoted as:

$$I_{th}(T)=I_0 \times \exp(T/T_0),$$

where $I_0$ and $T_0$ are constant. Furthermore, the slope of the I-L characteristics, which is often called as the slope efficiency η, becomes smaller as the temperature increases. When the APC circuit controls the bias current Ib so as to maintain the average power P(A) in constant; the modulation current Im to keep the extinction ratio ER in constant roughly shows an inverse proportional to the slope efficiency η, that is, the modulation current Im is necessary to be increased to maintain the extinction ratio independent of the temperature. This means that, when the APC circuit keeps the average output power P(A) in constant and the extinction ratio ER is also kept constant, the instant operating point of the LD exists on the line giving the slope efficiency η. Under such a condition, the modulation current Im can be approximately denoted by an exponential function similar to the threshold current described above.

Next, a method or process to form the optical transceiver having the architecture descried above will be explained, in particular, a method to evaluate characteristics of an LD installed in the optical transceiver 1.

The method first assembles the OSA 2 to install the LD 8 and the PD 9. In an alternative, only an LD 8 is installed within a package of the OSA 2. Then, the method measures the I-L characteristics of the LD in the OSA under at least three temperatures of a low temperature $T^{(low)}$, a room temperature $T^{(RT)}$, and a high temperature $T^{(high)}$. Note that the measurement of the I-L characteristics is carried out under a condition where the OSA 2 is not installed within the optical transceiver 1; that is, the light emitted by the LD 8 is directly detected without any optical coupling system such as an optical fiber, lenses, and so on. This step of the measurement obtains the threshold currents, $I_{th}^{(low)}$, and $I_{th}^{(RT)}$, and $I_{th}^{(high)}$, and the slope efficiencies, $\eta^{(low)}$, $\eta^{(RT)}$, and $\eta^{(high)}$, at three temperatures.

Then, the optical transceiver 1 is assembled by installing the OSA 2 therein. Activating the APC circuit 5 under the room temperature $T^{(RT)}$ to determine the bias current $Ib^{(RT)}$ and the controller 7 determines the modulation current at the room temperature $Im^{(RT)}$ so as to set the extinction ratio ER in the preset range. The latter step to determine the modulation current $Im^{(RT)}$ is carried out by monitoring the light output from the optical transceiver 1 and practically measuring the extinction ratio thereof by the visual inspection or by a specific apparatus to determine the extinction ratio automatically as varying the modulation current Im.

The method then determines initial targets, $Im^{(low)\prime}$ and $Im^{(high)\prime}$, for the modulation current Im at temperatures of $T^{(high)}$ and $T^{(low)}$ based on equations below by referring the predetermined modulation current at the room temperature $Im^{(RT)}$. That is:

$$Im^{(low)\prime}=Im^{(RT)} \times \eta^{(low)}/\eta^{(RT)}$$

$$Im^{(high)\prime}=Im^{(RT)} \times \eta^{(high)}/\eta^{(RT)}.$$

Because the instant operating points of the LD always exists on the straight line in the I-L characteristic under the operation of the ACP circuit, the initial targets for the modulation current Im may be estimated from the temperature dependence of the slope efficiency obtained in the form of the OSA. The method then assumes a behavior between the modulation current Im and the temperature T by three parameters of $Im^{(RT)}$, $Im^{(high)\prime}$ and $Im^{(low)\prime}$, which is called as T-Im characteristic; and temporarily creates an LUT for the modulation current Im against the temperature T based on thus created T-Im characteristic. The T-Im characteristic is generally denoted as:

$$Im(T) \sim a \times \exp(b \times T)+c,$$

where a, b and c are parameters obtainable from three data of $Im^{(RT)}$, $Im^{(high)\prime}$ and $Im^{(low)\prime}$.

Then, the process sets the bias current $Ib^{(low)}$ at a low temperature by setting the ambient temperature of the optical transceiver 1 in $T^{(low)}$ and activating the APC circuit. The method senses the practical current temperature $T^{(low)}$ by the temperature sensor 3 and determines the initial modulation current $Im_0^{(low)}$ at this practical temperature $T^{(low)}$ by referring to the LUT created previously. The controller 7 first sets thus determined modulation current $\text{Im}_0^{(low)}$ in the driver 4, and concurrently monitors the extinction ratio ER of the light output from the optical transceiver 1. When the extinction ratio ER is out of the preset range, the controller calculates the next modulation current Im by the procedures described below.

That is, the optical power output from the LD 8 is given by:

$$P(A)=\{P(0)+P(1)\}/2 \quad (1)$$

$$ER[dB]=10\times\log\{P(1)/P(0)\} \quad (2)$$

$$\Delta P(A)=P(1)-P(0) \quad (3)$$

Only the difference $\Delta P(A)$ is directly observable during the procedures to determine the modulation current Im. So, evaluating $P(1)$ and $P(0)$ from equations (1) and (2), and substituting thus determined two parameters $P(1)$ and $P(0)$ into equation (3), the difference between two optical levels $\Delta P$ may be written by:

$$\Delta P(A)=2\times P(A)\times\{10^{(ER/10)}-1\}/\{10^{(ER/10)}+1\} \quad (4)$$

Because the relation of equation (4) appears under the current modulation current $\text{Im}^{(cur)}$ and another modulation current $\text{Im}^{(tar)}$ at which the extinction ratio ER becomes within the preset range, the following two equations are given:

$$\Delta P^{(cur)}=2\times P(A)^{(cur)}\times\{10^{(ER(cur)/10)}-1\}/\{10^{(ER(cur)/10)}+1\}, \text{ and}$$

$$\Delta P^{(tar)}=2\times P(A)^{(tar)}\times\{10^{(ER(tar)/10)}-1\}/\{10^{(ER(tar)/10)}+1\}.$$

Taking the ratio of the two equations, we obtain:

$$\Delta P^{(tar)} = \Delta P^{(cur)} \times \{P(A)^{(tar)}/P(A)^{(cur)}\} \times [\{10^{(ER(tar)/10)} - 1\}/ \quad (5)$$
$$\{10^{(ER(tar)/10)} + 1\}]/[\{10^{(ER(cur)/10)} - 1\}/\{10^{(ER(cur)/10)} + 1\}].$$

When the APC circuit is active, the term of equation (5) relating to the average power, namely, $P(a)^{(tar)}/P(a)^{(cur)}$, becomes substantially unity. Further assuming that the operating points of the LD 8 are limited on the straight line in I-L characteristic in any instants, the current difference $\Delta P^{(cur)}$ and the target difference $\Delta P^{(tar)}$ are equivalently equal to the current modulation current $\text{Im}^{(cur)}$ and the target modulation current $\text{Im}^{(tar)}$. Then, the next modulation current $\text{Im}^{(tar)}$ to be set in the driver 4, which gives the target extinction ratio $ER^{(tar)}$ within the preset range, is given by:

$$Im^{(tar)} = Im^{(cur)} \times [\{10^{(ER(tar)/10)} - 1\}/ \quad (6)$$
$$\{10^{(ER(tar)/10)} + 1\}]/[\{10^{(ER(cur)/10} - 1\}/\{10^{(ER(cur)/10)} + 1\}].$$

Iterating the evaluating loop for the modulation current Im until the target extinction ratio $ER^{(tar)}$ is obtained, the final modulation current in the low temperature $\text{Im}^{(low)}$ determined. Thus, under a condition where the APC circuit 5 is active, two modulation currents, $\text{Im}^{(RT)}$ and $\text{Im}^{(low)}$, which give the target extinction ratio ER are obtained in two temperatures, $T^{(RT)}$ and $T^{(low)}$. The method next revises the T-Im characteristic replacing the $\text{Im}^{(low)}$ by newly determined value $\text{Im}^{(low)}$ at the practical low temperature $T^{(low)}$, which enhances the adequacy of the estimation for the initial modulation current at a high temperature $T^{(high)}$.

Then, the method raises an ambient temperature to a high temperature and sets the bias current $\text{Ib}^{(high)}$ by activating the APC circuit. Reading the current temperature within the optical transceiver 1 by the temperature sensor 3, the initial modulation current $\text{Im}_0^{(high)}$ is set in the driver 4 by referring to the newly revised T-Im characteristic. When the extinction ratio ER is out of the preset range, the next modulation current $\text{Im}^{(high)}$ is calculated in a manner same as those described in a case of the low temperature. These procedures are iterated until the preset range for the extinction ratio ER is obtained. Thus, the modulation current $\text{Im}^{(high)}$, by which the preset extinction ration ratio ER is realized, may be determined.

The process to determine the modulation current Im is carried out for three independent temperatures, $T^{(RT)}$, $T^{(low)}$ and $T^{(high)}$. Replacing the initial condition $\text{Im}^{(high)}$ for the high temperature, which is evaluated for the OSA 2, into thus determined value $\text{Im}^{(high)}$ practically obtained for the optical transceiver 1, the LUT for the T-Im characteristic is further precisely revised.

According to the method to form an optical transceiver 1 thus described, a plurality of the I-L characteristics are first measured at several temperatures for the OSA 2, then measures the modulation current Im to show the extinction ratio ER within the preset range at several temperatures as activating the APC circuit to maintain the average output power in constant after the OSA 2 is installed within the optical transceiver. The process revises the T-Im characteristic as replacing the modulation current Im by which the extinction ratio ER for the light output from the optical transceiver is practically obtained by the optical transceiver 1.

Because the T-Im characteristic is first created by using the I-L characteristics obtained for the OSA 2 and revised as the modulation current Im is practically obtained at respective temperatures; not only the T-Im characteristic becomes adequate but a period to determine the modulation current Im becomes shorter. Thus, a time to create the LUT for T-Im characteristic, to check the optical transceiver electrically, and to adjust the operation may be shortened.

Next, advantages of the method according to the embodiment described above will be described. A delivery inspection of an optical transceiver includes the measurement of fundamental characteristics optically and electrically, and the creation of the LUT for the T-Im characteristics. Conventionally, an optical transceiver is checked such that, as activating the APC circuit at the room temperature around 35° C., the bias current Ib is first measured to get the target optical power output from the optical transceiver; then the modulation current Im is determined so as to set the preset extinction ratio ER by practically monitoring the optical signal output from the optical transceiver. Iterating the check to obtain the combination of the bias current Ib and the modulation current Im by a manner same as those at the room temperature as varying the temperature in low, −40° C., and in high, 85° C., the LUT correlating the modulation current Im with the temperature is created. In those procedures, the temperature is the ambient temperature of the optical transceiver, not that of the LD itself. One of agreements or standards to specify the performance of the optical transceiver defines the temperature of the optical transceiver to be that of the housing temperature immediate above the portion where the OSA is mounted.

The conventional method to create the LUT above described causes ambiguities in data obtained by the measurement when the ambient temperature is varied. That is, when the ambient temperature is varied, it causes a time lag until the temperature of the LD practically becomes substantially equal to the ambient temperature due to the heat capacity of the optical transceiver. Evaluating the modulation current Im and the bias current Ib under an insufficient condition of the temperature, the finally evaluated values become inaccurate, or, it takes a long time to get the accurate data finally.

According to the method of the present embodiment, target currents, Ib and Im, are accurately evaluated in a shorter period. In particular, just after the variation of the ambient temperature, the practical temperature of the LD gradually approaches the target ambient temperature, namely, not in a condition under the target ambient temperature. Then, even when the extinction ratio ER becomes within the preset range at one measurement, the next measurement of the extinction ratio ER may possibly miss the preset range. The measurement of the modulation current Im cannot vary converging parameters even the measurement is carried out by a feedback loop. On the other hand, the determination of the bias current Ib is fully carried out by the negative feedback loop to vary loop parameters. For instance, the loop gain is variable by changing the conversion gain of the PD from the optical input to the current output, or, the target of the bias current Ib is variable by modifying the target value for the output current of the PD. Adjusting such feedback parameters, a time to converge the loop is generally shortened. According to the method of the present embodiment for determining the modulation current Im, not only the accuracy of the modulation current to be determined enhances but the time or the iteration to the convergence is remarkably shortened.

Although the present invention has been fully described in conjunction with the preferred embodiment thereof with reference to the accompanying drawings, it is to be understood that various changes and modifications may be apparent to those skilled in the art. For instance, the embodiment determines the threshold current $I_{th}$ and the slope efficiency $\eta$ at three temperatures of $T^{(RT)}$, $T^{(low)}$ and $T^{(high)}$. This determination is satisfied by obtaining at least two data on the straight line of I-L characteristic. In other words, assuming the linear dependence of the light output from the LD against the current, at least two data on the straight line of the I-L characteristic at a temperature may calculate the modulation current Im and the bias current Ib to generate light with the preset average power and the extinction constant ER. Total six data may calculate anticipated modulation current at respective temperatures, and $Im_a^{(low)}$, $Im_a^{(RT)}$, and $Im_a^{(high)}$, and the LUT for the T-Im characteristic may be created.

One alteration of the algorithm described above is that, the modulation current $Im^{(RT)}$ determined based on the LUT of the T-Im characteristic using the $Im_a^{(RT)}$ as the initial condition often becomes greater than the initial condition thereof. $Im_a^{(RT)}$ because the determined modulation current $Im^{(RT)}$ is evaluated by the optical transceiver 1, while, the initial condition is obtained by the OSA and the temperature of the OSA within the optical transceiver 1 is usually higher than the temperature of the optical transceiver under which the modulation current $Im^{(RT)}$ is determined. Sliding the T-Im characteristic determined by the OSA level to create the next T-Im characteristic such that the modulation current Im becomes equal to the $Im^{(RT)}$ at the temperature $T=T^{(RT)}$, the initial condition in the low temperature $Im_0^{(low)}$ may be set based on the next T-Im characteristic thus created. After the determination of the modulation current in the low temperature $Im^{(low)}$, the LUT of the next T-Im characteristic is revised by the modulation currents, $Im^{(RT)}$ and $Im^{(low)}$, practically determined, and the data $Im_a^{(high)}$ obtained in advance to calculate the initial condition $Im_0^{(high)}$ in the high temperature.

Accordingly, such changes and modifications are to be understood as included within the scope of the present invention as defined by the appended claims, unless they depart therefrom.

What is claimed is:

1. A method to form an optical transceiver that installs a semiconductor laser diode (LD), comprising steps of:
   before the LD is installed in the optical transceiver, measuring an I-L characteristic of the LD, the I-L characteristic relating a current supplied to the LD with optical power output from the LD;
   installing the LD within the optical transceiver; and
   determining a modulation current as varying a temperature of the optical transceiver by a feedback loop with an initial condition by referring to a look-up-table (LUT) relating the modulation current (Im) with temperatures (T), the modulation current being supplied to the LD to keep an extinction ratio of light output from the optical transceiver in a preset range as a bias current (Ib) supplied to the LD is automatically determined by an automatic power control (APC) circuit to keep an average of the optical power output from the LD in a preset level,
   wherein the step of determining the modulation current includes steps of:
   setting the initial condition in the feedback loop;
   monitoring the extinction ratio of the light output from the optical transceiver; and
   modifying the modulation current according to an equation of:

$Im^{(tar)} = Im^{(cur)} \times [\{10^{(ER(tar)/10)}-1\}/\{10^{(ER(tar)/10)}+1\}]/[\{10^{(ER(cur)/10)}-1\}/\{10^{(ER(cur)/10)}+1\}]$, where Im(cur) is the modulation current currently supplied to the LD, the Im(tar) is a next modulation current modified from the current modulation current Im(cur), ER(cur) is the extinction ratio currently monitored, and ER(tar) is a target extinction ratio,
   wherein the LUT is revised by replacing data based on the I-L characteristic of the LD with the modulation current practically determined for the light output from the optical transceiver.

2. The method of claim 1,
   wherein the step of measuring the I-L characteristic includes a step of determining slope efficiencies at the temperatures,
   wherein the LUT is first created by the modulation current that is practically determined and slope efficiencies of the I-L characteristic.

3. The method of claim 2,
   wherein the LUT is first created by data calculated according to an equation of:

$Im^{(T)} = Im^{(RT)} \times \eta^{(T)}/\eta^{(RT)}$, where $Im^{(RT)}$ is the modulation current practically measured at a room temperature of the optical transceiver, $\eta^{(RT)}$ is the slope efficiency of the I-L characteristic measured for the LD at the room temperature, $\eta^{(T)}$ is the slope efficiency of the I-L characteristic measured for the LD at another temperature T, and $Im^{(T)}$ is an estimated modulation current at the another temperature T, and
   wherein the LUT is revised by the estimated modulation current $Im^{(T)}$ and the modulation current $Im^{(RT)}$ at the room temperature.

4. The method of claim 2,
   wherein the I-L characteristic is measured at two currents different from others in respective temperatures.

5. The method of claim 1,
   wherein the step of measuring the I-L characteristic includes a step of determining anticipated modulation currents at respective temperatures, the anticipated modulation currents setting an extinction ratio of light output from the LD in the preset range, and wherein the LUT is first created by the anticipated modulation currents.

6. A method to form an optical transceiver that installs a semiconductor laser diode (LD), comprising steps of:

before the LD is installed in the optical transceiver, measuring I-L characteristics of the LD at temperatures to determine slope efficiencies at the respective temperatures, the I-L characteristics relating a current supplied to the LD with optical power output from the LD;

creating a look-up-table (LUT) that relates modulation currents $Im^{(T)}$ and the slope efficiencies $\eta^{(T)}$ at the respective temperatures, where the modulation currents $Im^{(T)}$ are calculated from an equation of:

$$Im^{(T)} = Im^{(RT)} \times \eta^{(T)}/\eta^{(RT)},$$

where $Im^{(RT)}$ is the modulation current practically measured at a room temperature of the optical transceiver, $\eta^{(RT)}$ is the slope efficiency of the I-L characteristic measured for the LD at the room temperature, $\eta^{(T)}$ is the slope efficiency of the I-L characteristic measured for the LD at another temperature T, and $Im^{(T)}$ is an estimated modulation current at the another temperature T;

installing the LD within the optical transceiver; and determining a modulation current as varying a temperature of the optical transceiver by a feedback loop with an initial condition by referring to the look-up-table (LUT), the modulation current being supplied to the LD to keep an extinction ratio of light output from the optical transceiver in a preset range as a bias current (Ib) supplied to the LD is automatically determined by an automatic power control (APC) circuit to keep an average of the optical power output from the LD in a preset level, wherein the LUT is revised by replacing data evaluated from the I-L characteristic of the LD with the modulation current practically determined for the light output from the optical transceiver.

* * * * *